United States Patent
Venkatraman et al.

(10) Patent No.: US 12,322,634 B2
(45) Date of Patent: *Jun. 3, 2025

(54) ELECTROSTATIC CHUCK PREPARED BY ADDITIVE MANUFACTURING, AND RELATED METHODS AND STRUCTURES

(71) Applicant: ENTEGRIS, INC., Billerica, MA (US)

(72) Inventors: Chandra Venkatraman, Tyngsboro, MA (US); Scott Sirignano, Azle, TX (US); Yan Liu, Lexington, MA (US); Subhash Guddati, Singapore (SG); Thines Kumar Perumal, Singapore (SG); Montray Leavy, Singapore (SG); Jakub Rybczynski, Arlington, MA (US); Carlo Waldfried, Middleton, MA (US)

(73) Assignee: ENTEGRIS, INC., Billerica, MA (US)

( * ) Notice: Subject to any disclaimer, the term of this patent is extended or adjusted under 35 U.S.C. 154(b) by 674 days.

This patent is subject to a terminal disclaimer.

(21) Appl. No.: 17/558,381

(22) Filed: Dec. 21, 2021

(65) Prior Publication Data

US 2022/0208592 A1    Jun. 30, 2022

Related U.S. Application Data

(60) Provisional application No. 63/132,634, filed on Dec. 31, 2020.

(51) Int. Cl.
*H01T 23/00*    (2006.01)
*H01L 21/683*   (2006.01)
*B22F 10/28*    (2021.01)
*H02N 13/00*    (2006.01)

(52) U.S. Cl.
CPC .......... *H01L 21/6833* (2013.01); *B22F 10/28* (2021.01); *H02N 13/00* (2013.01)

(58) Field of Classification Search
None
See application file for complete search history.

(56) References Cited

U.S. PATENT DOCUMENTS

| | | | |
|---|---|---|---|
| 9,737,934 B2 | 8/2017 | Lafarre | |
| 10,384,265 B2 | 8/2019 | Swaminathan | |
| 10,607,874 B2 | 3/2020 | Maehata | |
| 10,722,947 B2 | 7/2020 | Cullinan | |
| 11,837,492 B2 * | 12/2023 | Liu | H01L 21/68757 |
| 2003/0047283 A1 * | 3/2003 | Parkhe | C23C 16/4581 |
| | | | 118/728 |
| 2005/0045106 A1 | 3/2005 | Boyd, Jr. | |
| 2009/0080136 A1 | 3/2009 | Nagayama | |
| 2009/0291500 A1 * | 11/2009 | Takada | C08F 220/287 |
| | | | 106/13 |
| 2010/0103584 A1 | 4/2010 | Nam | |

(Continued)

FOREIGN PATENT DOCUMENTS

| | | |
|---|---|---|
| CN | 107851592 A | 3/2018 |
| CN | 108995219 A | 12/2018 |

(Continued)

*Primary Examiner* — Stephen W Jackson

(57) ABSTRACT

Described are electrostatic chucks that are useful to support a workpiece during a step of processing the workpiece, and electrostatic chuck base components prepared by an additive manufacturing technique.

19 Claims, 5 Drawing Sheets

(56) References Cited

U.S. PATENT DOCUMENTS

| | | | |
|---|---|---|---|
| 2013/0131248 A1* | 5/2013 | Tanase | C09D 7/62 |
| | | | 524/413 |
| 2014/0154465 A1* | 6/2014 | Sun | H01L 21/6831 |
| | | | 156/89.12 |
| 2014/0177123 A1* | 6/2014 | Thach | H01L 21/67103 |
| | | | 361/234 |
| 2016/0352260 A1 | 12/2016 | Comendant | |
| 2017/0243726 A1 | 8/2017 | Kellogg | |
| 2018/0216229 A1 | 8/2018 | Sershen | |
| 2019/0135705 A1 | 5/2019 | Yasui et al. | |
| 2020/0251315 A1 | 8/2020 | Saito | |
| 2020/0365374 A1 | 11/2020 | Narendrnath | |
| 2022/0139681 A1* | 5/2022 | Erickson | H01J 37/32715 |
| | | | 361/234 |

FOREIGN PATENT DOCUMENTS

| | | |
|---|---|---|
| CN | 217239427 U | 8/2022 |
| JP | 2019081357 A | 5/2019 |
| JP | 2019084823 A | 6/2019 |
| KR | 20200029655 A | 3/2020 |
| TW | 201931505 A | 8/2019 |
| WO | 1999029001 A2 | 6/1999 |
| WO | 2020185467 A1 | 9/2020 |

\* cited by examiner

ELECTROSTATIC CHUCK PREPARED BY ADDITIVE MANUFACTURING, AND RELATED METHODS AND STRUCTURES

CROSS-REFERENCE TO RELATED APPLICATIONS

This application claims the benefit under 35 USC 119 of U.S. Provisional Patent Application No. 63/132,634, filed Dec. 31, 2020, the disclosure of which is incorporated herein by reference in its entirety.

FIELD

The disclosure is in the field of a base component of an electrostatic chuck that is useful to support a workpiece during a step of processing the workpiece, with the base component ("base") being prepared by an additive manufacturing step.

BACKGROUND

Electrostatic chucks (also referred to simply as "chucks," for short) are used in semiconductor and microelectronic device processing. A chuck holds in place a workpiece such as a semiconductor wafer or microelectronic device substrate to perform a process on a surface of the workpiece. In particular, the electrostatic chuck supports and secures the workpiece at an upper surface of the chuck by creating an electrostatic attractive force between the workpiece and the chuck. A voltage is applied to electrodes that are contained within the chuck to induce charges of opposite polarities in the workpiece and the chuck.

The chuck includes various structures, devices, and designs that allow the chuck to perform or that improve performance. Typical electrostatic chucks assemblies are multi-component structures that include: a flat upper surface that supports a workpiece; electrical components such as electrodes, a conductive coating, and ground connections to control electrostatic charges of the chuck and a supported workpiece; temperature control systems (e.g., cooling systems) to control temperatures of the chuck and a supported workpiece; various other components that may include measurement probes and moveable pins used to support or to change a position of a workpiece relative to the chuck; and temperature control medium connections and electrical connections to extend from the chuck to a tool interface.

A typical feature of an electrostatic chuck is a base that contains a temperature control system (e.g., cooling system). The temperature control system includes a pattern of channels or passages formed at the interior of the chuck that allow a fluid (e.g., gas, water, or another liquid) to flow through the interior of the chuck to remove heat from the chuck and to control a temperature of a supported workpiece during or after a processing step. For example, the workpiece may experience an increased temperature while being supported by the chuck during a semiconductor processing step. A cooling fluid that passes through the cooling system of the chuck can be useful to remove heat from the workpiece and control the temperature of the workpiece.

A base of an electrostatic chuck assembly must be made of a high strength, solid material that can be processed to form a structure having highly precise features such as dimensions, flatness, surface roughness, intricate temperature control channels, and apertures. Current materials that are used for manufacturing bases of electrostatic chucks include aluminum and other metals or ceramics that can be formed into a precision base structure by machining techniques. Other than alumina, these materials can exhibit high hardness properties, which make them difficult and expensive to manufacture using high precision machining techniques.

By existing methods, to form a base that contains internal (enclosed) cooling channels, two opposed pieces are formed by machining, in separate portions (e.g., halves), and the two separately-formed pieces are bonded together, typically by a vacuum brazing step or an e-beam welding step.

Vacuum brazing is a specialized process used in the aerospace industry and can be both expensive and not readily available. Vacuum brazing involves forming a bond between two opposed surfaces by melting a "filler material" placed between the two surfaces, using a furnace, and allowing the melted filler material to then solidify and form a bond or vacuum-brazed joint. The filler material may be a material that melts at a temperature lower than a melting temperature of the two pieces being bonded. The joint that is formed by the "filler" material is typically detectable in the vacuum-brazed structure. Overall, the combination of forming two separate pieces, each by complex machining steps, followed by a vacuum brazing step, results in high material and processing costs as well as potentially lengthy manufacturing lead times.

Alternative processes use formed tubing as placeholders for cooling channels, followed by casting a material over the tubing to form the base.

The hurdles in fabricating electrostatic chuck base call for further improvements in materials and fabricating process of the electrostatic chuck.

SUMMARY

In one aspect, the disclosure relates to an chuck (e.g., electrostatic chuck) base comprising an inorganic composite, the base comprising: an upper base surface made of the inorganic composite, a lower base surface made of the inorganic composite, an interior portion between the upper base surface and the lower base surface, made of the inorganic composite, and—channels (e.g., cooling channels) within the interior portion, enclosed by the inorganic composite; the upper base surface, the lower base surface, and the interior portion include a continuous layer of the inorganic composite that extends from the upper base surface to the lower base surface.

In another aspect, the disclosure relates to a method of forming a chuck (e.g., electrostatic chuck) base by additive manufacturing. The method comprising: forming a lower portion that includes a continuous bottom surface, by additive manufacturing; forming a middle portion that includes channels (e.g., cooling channels), over the lower portion, by additive manufacturing, and forming an upper portion that includes a continuous upper surface, over the middle portion, by additive manufacturing.

Figure 1:
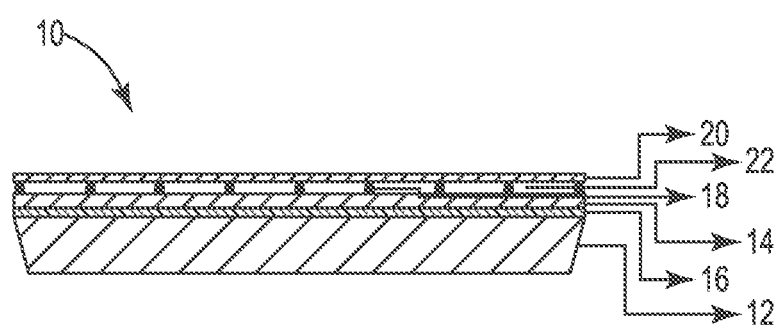
FIG. 1 is a side-view of an electrostatic chuck assembly as described.

The drawings are schematic, exemplary, and not necessarily to scale.

DETAILED DESCRIPTION

The following description relates to methods for preparing solid, substantially non-porous, three-dimensional structures, such as a base structure that is useful as a component of an electrostatic chuck assembly, by additive manufacturing methods. These include methods that are commonly referred to as "3-D printing" techniques.

Chucks (e.g., electrostatic chuck) include a base component that supports various functions of a chuck assembly, including heat dissipation, backside gas flow, electrical connections, among others. For advanced applications, a base may also preferably be prepared to exhibit a coefficient of thermal expansion that is within a range of a coefficient of thermal expansion of another component of the assembly, a ceramic layer, to enhance thermal performance and flatness of the chuck assembly. Traditional methods of preparing a base component of an electrostatic chuck involve machining techniques, which do not easily meet some or all physical requirements of a base, depending on material type of the base. For ceramic materials, machining is extremely challenging and forming buried (internal) channels (e.g., cooling channels) is very difficult.

Additive manufacturing methods generally involve a series of individual layer-forming steps that sequentially form multiple layers of solidified feedstock composition derived from a layer of feedstock. Using a series of additive manufacturing steps, each step forming a single layer of a structure, multiple layers of solidified feedstock are sequentially formed into a structure that is referred to herein as a multi-layer composite (or "composite").

As used herein, the term "composite" (or "multi-layer composite") refers to a structure formed by additive manufacturing, by sequentially forming a series of multiple individual and individually-formed layers of solidified feedstock. The composite may take the form of a base of an electrostatic chuck ("base"), or may be one or more portions of a base, e.g., a lower portion and an interior portion of a base. A composite that is a base structure that includes each of a top portion (having a top surface), a bottom portion (having a bottom surface), and an interior portion (e.g., containing cooling channels), with all three portions being formed and held together exclusively by layer formation steps of an additive manufacturing method (e.g., without using a vacuum brazing step or any other type of bonding step to bond together two separately-produced pieces), may be referred to herein as a "continuous" base or a "continuous layer" of a base.

The term "continuous" in this context means that the base or layer structure is formed as a single-piece composite structure from multiple sequentially-formed layers. The forming of the composite structure can be a continuous or non-stopping process. The term "continuous" does not refer to a structure that is prepared by separately forming two individual pieces and then bonding the two separately-formed pieces together, for example by a vacuum brazing technique or a different type of bonding technique. A continuous base structure is seamless and/or includes materials that are uniform in composition throughout the base structure. The continuous base does not include a seam or a boundary that results from a bonding step, especially a seam or boundary that is made of a bonding or filler material that has a composition that is different from the materials of the base. A continuous base structure does not include base structures formed by bonding more than one separated parts with or without a bonding or filler material, even if the separate parts may include the same material.

One specific example of an additive manufacturing technique is the technique commonly referred to as "selective laser melting." Selective laser melting (SLM), also known as direct metal laser melting (DMLM) or laser powder bed fusion (LPBF), is a three-dimensional printing method that uses a high power-density laser to melt solid particles of a feedstock material, which allows the melted (liquid) material of the particles to flow to form a continuous layer of the melted material, and then allowing the continuous layer to cool and solidify to form solidified feedstock. According to certain particular example methods, the particles of the feedstock can be fully melted to form a liquid (i.e., liquefied), and the liquid material is allowed to flow to form a substantially continuous, substantially non-porous (e.g., greater than 80, 85, or 90 percent porosity) film that then cools and hardens as a solidified feedstock layer of a multi-layer composite.

Selective laser melting methods include features that are similar to another additive manufacturing technique known as selective laser sintering ("SLS"). Selective laser sintering uses laser energy to cause particles of a feedstock material to become sintered, i.e., fused without particles being melted. This results in a structure formed by material of the heated particles, with spaces between the particles, meaning that the structure is porous. In contrast, selective laser melting can be used to cause particles to become fully melted to form a solid (substantially non-porous) three-dimensional structure.

The present description relates to using an additive manufacturing technique, e.g., selective laser melting, to form a base of an electrostatic chuck. Additive manufacturing techniques can be cost-effective techniques for forming these base structures, especially compared to previous methods that include complex and difficult machining techniques, and steps of separately forming multiple (e.g., two) individual pieces of a base and then bonding the multiple pieces together to form a completed base structure, such as by a vacuum brazing step.

Additive manufacturing techniques may be useful for forming base structures made from a broad range of materials, including metal materials (including alloys) and metal matrix composite materials. With additive manufacturing techniques, including selective laser melting techniques, the range of possible metals, alloys, and metal matrix composites that can be used to form a base can advantageously include materials that are not easily formed into a useful base structure by previous techniques such as machining techniques. The range of materials available with additive manufacturing techniques includes metals and metal alloys that can be melted by laser energy, such as aluminum alloys, titanium alloys, and various metal matrix composite materials, some of which are not easily processed by machining. Example materials may exhibit such high hardness that the materials can be difficult to process by machining techniques to form precise structures of an electrostatic chuck base, including precise dimensions and intricate channels (e.g., cooling channels). Using additive manufacturing techniques, these materials can be processed to form a base structure that includes intricate enclosed ("buried", "embedded" or defined) channels, even from materials that would be difficult to similarly form by using standard machining techniques.

The material that is used to prepare the base may be any material that is useful for preparing a base of an electrostatic chuck assembly, for example inorganic materials that include various metals (including alloys) and metal matrix composites. The term "metal" is used herein in a manner that is consistent with the meaning of the term "metal" within the metal, chemical, and additive manufacturing arts, and refers to any metallic or metalloid chemical element or an alloy of two or more of these elements.

The term "metal matrix composite" ("MMC") refers to a composite material made to include at least two constituent parts or two phases, one phase being a metal or metal alloy and another phase that is a different metal or another non-metal material such as a fiber, particle, or whisker, that is dispersed through a metallic matrix. The non-metal material may be carbon-base, inorganic, ceramic, etc. Some example metal matrix composite materials are made of combinations of: an aluminum alloy with alumina particles; an aluminum alloy with carbon; an aluminum alloy with silicon; an aluminum alloy with silicon carbide (SiC); a titanium alloy with $TiB_2$; a titanium alloy with silicon; a titanium alloy with silicon carbide (SiC).

Metal and metal alloys that may be useful according to methods of the present description include metal and metal alloys that have in the past been used for preparing base structures for electrostatic chuck assemblies, and, additionally, other materials that have not. Useful or preferred materials include metals such as iron alloys (e.g., stainless steel and other types of steel), titanium and titanium alloys, aluminum and aluminum alloys, and various metal matrix composite materials.

According to the present methods, a base may be prepared from a larger variety of materials than may be used for preparing a base from previous methods (e.g., machining methods). With a larger variety of materials available, a material for a base may be selected to provide physical properties that are particularly useful or desired in a base of an electrostatic chuck assembly, and in consideration of the materials used for other components of the assembly, such as an adjacent ceramic layer.

Coefficient of thermal expansion ("CTE") is a known physical property of metal, metal matrix composite, and ceramic materials. A material of a layer in the base of the present description, generally, may have a coefficient of thermal expansion that is comparable to coefficients of thermal expansion of various metal and ceramic materials that have been used previously to form components of base assemblies of electrostatic chucks. Some example materials that may be useful as a base or a ceramic layer of a base assembly as described, and their approximate CTE values, are as follows: alumina ($8.1 \times 10^{-6}$ m/(m K)), aluminum (21 to $24 \times 10^{-6}$ m/(m K)), Aluminum Alloy ($AlSi_7Mg$) (21 to $22 \times 10^{-6}$ m/(m K)), aluminum nitride ($5.3 \times 10^{-6}$ m/(m K)), stainless steel 440C ($10.2 \times 10^{-6}$ m/(m K)), stainless steel 17-4PH ($10.8 \times 10^{-6}$ m/(m K)), steel M2 (Tool) ($11 \times 10^{-6}$ m/(m K)), titanium ($8.6 \times 10^{-6}$ m/(m K)), titanium alloy Ti-6Al-4v (TC4)(8.7 to $9.1 \times 10^{-6}$ m/(m K)).

In exemplary terms, a useful or preferred coefficient of thermal expansion of a metal or metal matrix composite material used to prepare a base as described may be in a range of from $4 \times 10^{-6}$ m/(m K) to $30 \times 10^{-6}$ m/(m K), e.g., from $5 \times 10^{-6}$ m/(m K) to $25 \times 10^{-6}$ m/(m K).

In certain preferred base structures and electrostatic chuck assemblies, a material of a base may preferably be one that has a coefficient of thermal expansion that matches or is similar to a coefficient of thermal expansion of an adjacent layer of the assembly. Often, as part of an electrostatic chuck assembly, a base layer is located near, adjacent to, or otherwise sufficiently close to a ceramic layer of the assembly such that the base layer and the ceramic layer experience similar temperature conditions, and thermal expansion of one is affected by (e.g., constrained by) the other. If so, a useful combination of a base layer and a ceramic layer of the assembly can be made of materials that have approximately equal coefficients of thermal expansion. A preferred base of an electrostatic chuck assembly may have a coefficient of thermal expansion that is comparable to a coefficient of thermal expansion of a ceramic layer that is part of the same chuck assembly. A coefficient of thermal expansion of the base may be within 25, 20, 15, 10, or 5 percent of the coefficient of thermal expansion (m/(m-degree Kelvin)) of the ceramic layer.

A layer-by-layer approach of an additive manufacturing technique as described can allow for the formation of intricate, precise, and complex shapes that are highly effective structures when included in an electrostatic chuck base. Relative to machining techniques, additive manufacturing techniques as described can be more efficient in producing patterns (e.g., channels) that are highly intricate, that cover a large portion of a surface area of the base, that take up a large volume of the base structure relative to a total volume of the base structure, that have various cross-sectional shapes, or specifically designed (tailored) pattern. These patterns may be voids, openings, dents, cavities, channels, cutouts of designed shapes for various functionalities. These functionalities include heating, cooling, reducing weight, enhancing mechanical properties, providing supporting surface for stability, and other possible functionalities. In one example, the patterns are channels for cooling, where the coolants are allowed to flow through the channels to remove heat from the chuck and the work piece supported thereover.

Channels formed by additive manufacturing techniques may be of a different or a wide range of shapes (in cross-section), patterns (relative to a surface of a base assembly), and sizes (e.g., width or diameter of a channel), arrangements (relative positions of the channels), and may have surface features that allow for smooth and efficient flow of fluid through the channels. For example, while machining steps typically produce square channels (in cross section), additive manufacturing techniques may be useful to produce round channels (in cross section), which may allow for improved (laminar) flow through the channels as compared to turbulent flow through channels having a square cross-section. As another example, a channel may be formed to exhibit an asymmetric cross-section, which may allow for designs of channels that have improved heat transfer efficiency through a surface of the base. In another example, the additive manufacturing technique may form two or more channels interconnected therebetween. The two or more channels includes various cross-sectional shapes. In a further example, the two or more channels may have cross-sectional shapes different from one other.

Still another optional feature of channels formed as described may be a pattern of channels, relative to a (typically circular) surface area of the base and base assembly, that is designed for improved efficiency of heat transfer relative to a specific workpiece and non-uniform features of a specific workpiece that may be supported by a base assembly. This feature is sometimes referred to as "conformal cooling," and allows for the pattern of channels within the base to be designed and formed in the base in a specific design to match specific heat removal requirements of a workpiece (e.g., semiconductor or microelectronic device or wafer) that will be supported by an electrostatic chuck assembly during use. Additionally, additive manufacturing techniques allow for less complicated manufacturing methods for forming a base, including manufacturing methods that have fewer total steps, compared to previous methods of forming two separate base pieces and bonding the two pieces using a vacuum brazing step. By additive manufacturing, a complete (or substantially complete) functional base layer of an electrostatic chuck can be prepared using a single manufacturing process (a single additive manufacturing "step"), which offers high manufacturing efficiency in a reduced amount of time per unit (high manufacturing throughput). A base layer that is complete with substantially all required structure (including a bottom portion, interior portion, and top portion) may be prepared by a single series of additive manufacturing steps. For example, what can be referred to as a "one-step" additive manufacturing process to form a base structure can form many, most, or all required structures of a base (including a bottom portion, interior portion, and top portion) as a single continuous layer, as a multi-layer composite as described. A one-step additive manufacturing process avoids the need to form multiple separate pieces individually by separate steps, followed by a still additional step of bonding the multiple, separately-formed pieces together to form a functional base structure.

Still further, additive manufacturing techniques can be used to form a base that has highly precision dimensions. For example, the dimensional accuracy of the base is within +/−0.13 mm; the location (or position) accuracy of the base is within +/−0.13 mm; the perpendicularity is within +/−0.01 mm; the flatness is within +/−0.04 mm; the parallelism is less than 0.05 mm; the angular accuracy is within +/−0.5°; and/or the leak rate of enclosed features (e.g., channels) is less than $10^{-10}$ mbar L/s.

According to example methods, a base can be prepared to exhibit a high level of flatness, e.g., an "ultra-flat" surface, and the high level of flatness of the base can improve a level of flatness of an electrostatic chuck assembly, with flatness measured at an upper surface of a metal matrix composite layer of the assembly. Flatness is a typical property of an electrostatic chuck, or a base component of a chuck, and can be measured by known techniques, such as by using a coordinated measuring machine. In general, a flatness is measured and reported as a difference in height (in a z-direction) between a peak (highest measured point) and a valley (lowest measured point) of a measured surface, and is given in units of distance, e.g., microns. A base having a diameter of 300 millimeter, prepared by only a machining step, may be formed to exhibit a flatness as low as 30 microns. For a surface of a comparable base (300 millimeter diameter) as describe herein, a flatness of a base can be improved relative to a base formed exclusively by machining, by forming the base by an additive manufacturing step, and then further processing a base surface by a machining step. A flatness of a base surface after additive manufacturing may be below 45 or 50 microns, e.g., may be as low as 40 microns. The surface may be further processed by a machining step, such as lapping or polishing, to provide a still lower flatness, e.g., a flatness of less than 30 microns, e.g., less than 20 microns, or as low as about 15 microns.

For certain advanced applications of electrostatic chuck assemblies (e.g., Cryo, low angle implantation), useful chuck assemblies should exhibit an ultra-high flatness measured at the upper surface of the assembly (e.g., at a top of a ceramic layer. Preferred flatness values for certain applications of chuck assemblies may be below 10 microns, for a 300 millimeter chuck, measured at the upper ceramic surface. It is also important to maintain this ultra-high flatness property over a wide range of operating temperatures. Flatness levels of a chuck assembly over a range of temperatures can be improved by close matching of coefficient of thermal expansion values of different layers of a chuck assembly (a ceramic layer and a base layer), also with improved heat dissipation (heat removal by fluid flow through the base) from the assembly to extract heat, and also with improved flatness of surfaces of these layers at a bond between the layers. Materials used to form a base of a chuck assembly such as titanium, titanium alloys, and metal matrix composites, can result in improved CTE matching and improved flatness relative to previous materials commonly used to form a chuck base, such as aluminum, which is less stiff than these materials.

Additionally, example methods of the disclosure can be used to prepare a base to exhibit a relatively low roughness. Roughness is a typical property of a base of an electrostatic chuck, and can be measured by known analytic techniques, including as represented by an arithmetic average of a roughness profile of a surface (designated "Ra"), e.g., by using a 3D laser microscope or a stylus profilometer. Ra is calculated as the roughness average of a surface's measured microscopic peaks and valleys. Example surfaces of a base prepared by an additive manufacturing method as described, followed by a machining step to reduce roughness of a surface prepared by the additive manufacturing method, can have a surface roughness (Ra) that is less than 1 micron, e.g., less than 0.5 micron, or as low as about 0.1 micron. Roughness (Ra) can be determined by one of various standards methods, such as by ISO 4287-1:1984 or ASTM F 1048. Improved precision formation of a base allows for improved, more precise formation of a chuck assembly that includes a ceramic layer attached to the base, including improved flatness measured at the top of the ceramic layer. Typical bases prepared by machining methods, having a diameter of 300 millimeter, may be combined with a ceramic layer to form an assembly that exhibits a flatness as low as 30 microns measured at the upper ceramic surface. In example embodiments, a base layer of the present description can be combined with a comparable ceramic layer to form an assembly having a 300 millimeter diameter that exhibits a flatness that is below 30 microns measured at the upper ceramic surface, such as a flatness of less than 25 microns, e.g., less than 20 microns, or as low as about 15 or 10 microns. To achieve this low level of flatness of a metal matrix composite layer of a base assembly, the base layer may be formed by additive manufacturing, and a surface of the base assembly (that will contact the metal matrix composite layer) can be machined to improve the flatness of the surface produced by the additive manufacturing step.

Additional processes may be employed after the additive manufacturing processes. For example, a de-powdering process may be performed to remove loose powders generated during the additive manufacturing process as side produces. The de-powdering process removes loose powder from the surface of the chuck or channels by ultrasonic vibration assisted vacuum system, followed by compressed air blowing from a channel inlet to carry out loose powder. In another example, the additional processes may include a cleaning process to remove the contaminations on the chuck, such as oil or grease, that were induced during the additive manufacturing process. In a further example, heat treatment can be used to relieve the thermal stresses induced during the additive manufacturing process.

Methods of the present description use an additive manufacturing technique to form a base structure (e.g., a continuous base layer, or a portion of a base layer) by forming multiple layers of a composite, sequentially. The composite is formed from multiple layers that may each, individually, have any useful thickness, and from one or more materials that can be melted to flow and form a dense, inorganic (e.g., metallic or metal matrix composite) solid that is useful as a substantially non-porous material of a base structure.

Generally, a base may be considered to have a form of flat and thin, typically circular structure (viewed from a top and a bottom direction) such as a flat disk that includes two opposed flat and circular surfaces with a thickness therebetween. The two opposed surfaces operate as a top and a bottom of a base layer. An interior portion of a base is present between the two opposed surfaces. The interior portion can include a system of enclosed channels (e.g., cooling channels) that extend through the interior portion with a winding, meandering, twisting, circuitous, or serpentine path.

The channels are capable of containing a flow of fluid (e.g., water or another liquid or gaseous fluid) that can be used to control a temperature of the base during operation of the base. Other structures may also be formed into surfaces of the base, such as vertical openings ("apertures") that extend between the thickness and between the two opposed surfaces of the base (from the top to the bottom and over the entire thickness), or channels or grooves at one or both of the top surface and the bottom surface.

A functional base layer of a chuck assembly can be considered to include at least three different portions: a lower portion that includes a bottom surface; an upper portion that includes an upper surface that is opposite of the bottom surface; and a middle ("interior") portion that is disposed between the upper portion and the lower portion and that may contain a channel (e.g., cooling channel). Preferably, according to preferred methods as described, all three portions, and all layers thereof, can be produced by an additive manufacturing method by which a single (preferably un-interrupted) series of layer-forming steps is used, optionally and preferably with all layer-forming steps being performed on a single additive manufacturing apparatus, to form all layers of a functional base layer as a continuous, seamless layer of inorganic material that does not include any seam or internal boundary such as a seam or boundary that may be formed by a bonding step (e.g., vacuum brazing). "Un-interrupted" means that each layer-forming step in a series of additive manufacturing steps is performed in sequence without any different type of step (e.g., any type of non-layer-forming step) being performed between any two of the layer-forming steps, and without a bonding step (different from an additive manufacturing step) that bonds two pieces of the base layer together using a filler material, brazing material, adhesive material, or the like.

Such a method, as an example of the presently described methods, may include: forming a lower portion of a base that includes a bottom surface, by additive manufacturing; forming a middle portion of the base that includes cooling channels, over the lower portion, by additive manufacturing; and forming an upper portion of the base that includes an upper surface, over the middle portion, by additive manufacturing.

Each layer of a composite may be formed as desired, from a desired material, and with a desired thickness, to produce a base layer in the form of a multi-layer composite that has desired properties. By exemplary additive manufacturing methods, each layer is prepared from a collection of particles (referred to as "feedstock") that is generally in the form of a powder. A feedstock contains small particles made of one or a variety of different inorganic materials that can be melted by a high energy laser to liquefy and flow to form a continuous layer of the melted material, then cool to solidify to form a layer of a multi-layer composite.

Particles that are useful according to the present description may be any particles that can be processed to form a useful multi-layer composite as described. Particles may be included in a feedstock in the form of a powder that comprises, consists of, or consists essentially of inorganic particles that can be melted using energy from a high-energy laser to form a layer of a multi-layer composite.

Examples of useful particles include inorganic particles that are capable of being melted or liquefied by laser energy to form a layer of a base structure as described. Examples of such particles include inorganic particles that are made of metals (including alloys) and metal matrix composites. Some useful examples, generally, including metals and metal alloys such as aluminum, titanium, and their alloys, as well as metal matrix composites. One specific example of a useful aluminum alloy is AlSiMg. One specific example of a useful titanium alloy is $Ti_6Al_4V$.

Useful particles of a feedstock can be of any size (e.g., mean particle size) or size range that is effective, including small or relatively small particles on a scale of microns (e.g., having an average size of less than 500 microns, less than 100 microns, less than 50 microns, 10 microns, or less than 5 microns).

The particles can be selected to achieve effectiveness in processing as described, to be capable of being contained in a feedstock, formed into a feedstock layer, and melted to flow to form a continuous layer that can cool to form solidified feedstock as a layer of a multi-layer composite. The size, shape, and chemical makeup of the particles can be any that are effective for these purposes.

The particles can be in the form of a feedstock composition that can be used in an additive manufacturing process of the present description. According to examples, feedstock useful in an additive manufacturing process may contain particles that are capable of being melted to form a continuous, substantially non-porous layer of a multi-layer composite. The feedstock material is not required to contain any other material but may if desired optionally contain small amounts of other materials. Example feedstock compositions may contain at least 80, 90, or 95, 98, or 99 percent inorganic particles by weight, based on total weigh of a feedstock composition. Other ingredients may be present if desired, at low amounts, such as one or more of a flow aid, surfactant, lubricant, leveling agent, or the like.

Each layer of a multi-layer composite may be formed to have any useful thickness. A thickness of a layer of a multi-layer composite is measured of a layer of the composite after the layer has been formed by melting particles of a feedstock layer to form a continuous, melted, and then solidified layer of the composite. Example thicknesses of a layer of a composite may be in a range from 30 microns to 100, 200, or more microns, e.g., from 30 to 50, 60, 70, 80, microns up to 90, 100, 150, 200, 300, 400, or 500 microns. In example composite structures, all layers of the composite may have the same thickness or substantially the same thickness. In other example composite structures, the layers may not all have the same thickness, but different layers of the composite may each have different thicknesses.

According to certain example methods and base structures of the present description, a base may be prepared by additive manufacturing steps by forming layers of a composite to have different thicknesses at different portions of the base. Examples of these methods and structures involve forming one or more layers that have lower thicknesses (referred to as "fine layers"), e.g., at top and bottom portions of the base, and forming layers having greater thicknesses ("coarse layers"), e.g., at an inner portion (or middle portion) of the base between the top portion and the bottom portion. Alternately, the middle portion may include fine layers while the upper portions and the bottom portions include coarse layers.

The positions of one or more fine layers as part of a multi-layer composite (e.g., in the form of a base layer), relative to coarse layers, may be any useful positions. Various locations of coarse layers and fine layers of a composite, and various orders of forming coarse layers relative to fine layers, may be effective. However, according to specific embodiments of base structures and related methods as described, one or more fine layers may preferably be present at one or more surfaces of a base, while coarse layers may be present at an interior portion of the same base. In other words, the fine layers and the coarse layers may be formed alternately. The fine layers may desirably be located at the one or more surfaces because fine layers may exhibit more desirable physical properties relative to coarse layers (see below). Layers of an interior portion of a base, of which higher quality is less important, may be prepared from coarse layers to increase manufacturing efficiency (see below).

Forming layers of a base to have different thicknesses can produce advantages with respect to processing efficiency, and also with respect to physical properties of a base (or portions of a base). Forming one or more "coarse" layers of greater thicknesses will have a beneficial effect of increasing a rate of production, and efficiency, of a base. Thicker coarse layers may have reduced quality (see below) relative to thinner (fine) layers, but forming layers of relatively greater thickness will increase a rate of production (reduce the amount of time needed) of a base; the increased thicknesses of thicker (coarse) layers will reduce the total number of layers that must be formed, and the number of layer-forming steps needed, to produce a base having a particular thickness. A thickness of a coarse layer may be a thickness that is within a typical range of layers formed by an additive manufacturing method, e.g., a thickness in a range of from 70, 80, 90, or 100 microns up to 500 microns. A greater thickness of a coarse layer will reduce a number of steps and an amount of time required to form a finished multi-layer composite of a pre-determined total thickness.

Thickness of a layer formed by an additive manufacturing technique may affect physical properties (quality) of the layer, when the layer-forming step uses identical feedstock and an identical laser. For example, a thinner layer may form to contain fewer internal open spaces, or "pores," as compared to a thicker layer formed using identical feedstock and an identical laser. The presence of pores in a layer may be measured and expressed in terms of apparent density of a layer. In general, when using an additive manufacturing process that applies the same laser and the same laser power to a feedstock layer, for the same amount of time, an apparent density of a thicker (coarse) layer will be lower than an apparent density of a similar (e.g., fine) layer that has a lower thickness but is prepared from the same feedstock.

Apparent density refers to a measured density of a layer of a composite relative to an actual (or theoretical) density of the material used to form the layer in a one-hundred percent solid, non-porous (zero porosity), form. A layer of a composite will typically be a continuous solid material, because of being formed by a step that melts particles of a feedstock and allows the melted particles to flow and form a continuous layer (e.g., "film") from the material of the liquefied particles. Typically, however, the continuous solid material that is formed is not one-hundred percent solid but contains a small amount of void space or pores that are not removed during the layer-formation process. The pores can cause reduced performance in the base by potentially allowing a fluid (e.g., cooling water) to leak from channels, through porous material of the base, to the exterior of the base, particularly if the base is used in a process under vacuum.

Oftentimes, pores in a layer or a composite may be visible optically, with or without magnification, at a surface or at an interior portion of a composite. Alternately, these void spaces can be detected as a reduced density (apparent density) of a layer of a composite or a portion of a composite. A layer formed with no void spaces (100 percent solid inorganic material with zero percent pores) will have a density that is equal to the density of the inorganic material, without pores, used to prepare the layer. A mass of inorganic material that includes pores will have a density (apparent density) that is slightly lower than the density of the inorganic material.

A density of a layer (an apparent density, when including volume of pores in the layer) is a measure of the mass of the layer divided by the volume (including pore volume) of the layer, divided by the actual (theoretical) density value of the material used to form the layer with zero pore volume, and is reported as a percentage of the actual density. An apparent density value of a layer or a portion of a composite (or a base layer) as described may typically be relatively high, e.g., greater than 80, 90, 92, 96, 98, or 99 percent of the actual density of a material used to form the layer.

When forming a layer of a composite from inorganic particles, energy from a high-powered laser is used to melt the inorganic particles formed as a feedstock layer. The melted particles flow to form a continuous layer (e.g., a "film") that solidifies as a layer of the composite. Ideally (theoretically), the laser energy will completely melt all particles of a feedstock composition used to prepare the layer, and the flow of the liquefied particle material will form a void-free liquid layer that solidifies to form a void-free solid. In practice, however, layers that are formed this way may commonly include imperfections, voids, or partially non-melted particles, with the amount of these imperfections being greater for layers formed to have a greater thickness (for identical feedstock, using an identical laser, and an equal time of exposing the laser to an area of a feedstock layer).

A step of forming a coarse layer of a composite will include forming a feedstock layer having a higher thickness, and melting the particles of the feedstock. Using an equal amount of laser power for a coarse layer (having more particles) as may be used for melting particles of a fine layer (having fewer particles), and equal time of exposing the laser to an area of the feedstock, the amount of laser power available to melt the number of particles of the thicker feedstock layer (having a higher number of particle) is lower, per particle. Lower received laser energy per particle of a feedstock layer (which is a higher number of particles for a coarse feedstock layer) can cause a coarse layer to have a higher level of imperfections compared to a fine layer.

A higher amount of imperfections can correlate to a lower apparent density. An apparent density of a coarse layer will typically be lower than an apparent density of a fine layer, when using identical feedstock, an identical laser, and identical time of exposure of a laser to an area of a feedstock layer. In example methods and base structures, an apparent density of any layer of a base may preferably be at least 98 or 99 percent. More particularly, an apparent density of a coarse layer of a base may preferably be at least 99.0 percent, e.g., at least 99.2 or 99.4 percent. An apparent density of a fine layer of a base may preferably be greater than an apparent density of a coarse layer of the same base, and may be at least 99.4 percent, e.g., at least 99.6 percent.

Forming or more "fine" layers having reduced layer thicknesses can be useful to improve physical qualities of a base structure. Finer layers of a composite made by additive manufacturing methods have been found to exhibit useful or preferred physical properties such as higher density and a relatively lower amount of imperfections such as pores formed in the layer.

On the other hand, forming multiple fine layers having lower thicknesses during an additive manufacturing process will reduce the rate of production of a multi-layer composite, i.e., will increase the number of steps and the amount of time required to produce a multi-layer composite that has a particular thickness, because a higher number of the fine (thinner) layers must be formed, meaning that a higher number of additive manufacturing steps is required to build a multi-layer composite of a given thickness.

A thickness of a fine layer can be a thickness that is within a typical a range of thicknesses of layers formed by an additive manufacturing method, especially at a low end of the range, such as a thickness in a range from 30 microns to 100 microns, e.g., from 30 to 50, 60, 70, 80, or 90 microns.

An electrostatic chuck as described is a multi-piece (or "multi-component) structure that includes multiple components assembled together in layers to form an electrostatic chuck assembly. The assembly includes various structures and features that are typical of an electrostatic chuck assembly and that allow the chuck to support a workpiece (e.g., semiconductor substrate, a microelectronic device, a semiconductor wafer, a precursor thereof) during processing, with an electrostatic attractive force holding the workpiece in place at an upper surface (the "workpiece-contacting surface") of the chuck. Example workpieces used with an electrostatic chuck include semiconductor wafers, flat screen displays, solar cells, reticles, photomasks, and the like. The workpiece may have an area equal to or greater than that of a circular 100 millimeter diameter wafer, a 200 millimeter diameter wafer, a 300 millimeter diameter wafer or a 450 millimeter diameter wafer.

The chuck includes an upper "workpiece-contacting surface" that is adapted to support a workpiece during processing. The upper surface typically has a circular surface area with a circular edge that defines a perimeter of both the workpiece-contacting surface and the multi-layer chuck. As used herein, the term "workpiece-contacting surface" refers to the upper exposed surface of an electrostatic chuck that contacts a workpiece during use, and that includes a "main field" made of a ceramic material and having an upper surface, typically with embossments at the upper surface, and with an optional conductive coating that may cover a least a portion of the upper surface. The workpiece is held at the workpiece-contacting surface, in contact with upper surfaces of the embossments, above the upper surface of the ceramic material, and is held against or "clamped" to the electrostatic chuck during use of the electrostatic chuck. Example electrostatic chuck assemblies may be used with AC and DC Coulombic chucks and Johnsen-Rahbek chucks. In the present embodiments, the upper "workpiece-contacting surface" is formed by depositing fine layers of composite using additive manufacturing method.

The chuck assembly (or "chuck" for short) also includes a number of other layers, devices, structures, and features that are required or optional for the chuck to function. These include: an electrode layer that generates an electrostatic attraction between the chuck and the workpiece to hold the workpiece in place during processing; a grounding device such as a grounding layer and related electrical connections; measurement devices for measuring pressure, temperature, or an electrical property during a processing step; gas flow conduits as part of a temperature control function; backside gas flow function for gas flow and pressure control between the workpiece-contacting surface and a workpiece; a conductive surface coating; as well as others.

One layer of a typical chuck assembly is a ceramic layer (a.k.a., a dielectric layer) at an upper portion of the assembly. The ceramic layer may be a top layer of the assembly and may include the upper surface of the chuck, other than a conductive coating, embossments, or the like, placed on the upper surface of the ceramic layer. An electrically conductive coating at the upper surface may be connected to electrical ground through a grounding layer, a grounding pin, or the like, also included in the chuck assembly. The ceramic layer may be made of a useful ceramic material such as alumina, aluminum nitride, quartz, $SiO_2$ (glass), among others. The ceramic layer may be made of a single (integral) layer of material, or may alternately be made of two or more different materials, e.g., multiple layers of different materials, if desired. A total thickness of a ceramic layer (having one or multiple layers of ceramic materials) may be any effective thickness, for example a thickness in a range from 1 to 10 millimeters, e.g., from 1 to 5 millimeters.

The ceramic layer is supported below by a base layer ("base" for short), as described herein, which may be made of a metal, such as aluminum, aluminum alloy, titanium, titanium alloy, stainless steel, metal matrix composite, among others as described.

Typically between the ceramic layer and the base is one or more of: a bonding layer (e.g., a polymeric adhesive), an electrode, a grounding layer, an insulating layer that allows the electrodes and other layers to function electrically, or additional circuitry.

An example of a useful chuck assembly is shown at FIG. 1. Chuck assembly 10 includes base 12, ceramic layer (assembly) 14, and a bonding layer 16 that bonds base 12 to ceramic layer 14. Ceramic layer 14 includes subcomponents such as an electrode. At an upper surface of ceramic layer 14 is a pattern of embossments 18. As illustrated, wafer 20 is supported by the embossments. A space 22 is present between a lower surface of wafer 20 and an upper of ceramic layer 14. Space 22 is created by embossments 18 located at the upper surface of ceramic layer 14, which support wafer 20 at a slight distance above the upper surface of ceramic layer 18. During use, a flow of gas (e.g., cooling gas) can be passed through space 22, between wafer 20 and ceramic layer 14, to control (e.g., reduce) a temperature of wafer 20. Base 12 contains cooling channels (e.g., cooling channels), which are not specifically illustrated.

A chuck assembly of the present description includes a base component that includes channels (e.g., cooling channels). According to methods as described herein, the entire structure of the base and the internal channels are produced using an additive manufacturing technique such as a selective laser melting technique. A system of channels can be formed in a base during additive manufacturing of the base as a pattern of open space (e.g., "void" space) that forms connected channels distributed within the multi-layer composite formed to a base structure, i.e., channels are defined by an absence of the multi-layer composite material at locations of the channels, and no other structure is necessary to form or define the structure of the channels. The channels run throughout an interior of a base layer and require no structure or surface other than a space of the channel that is formed within the base layer during formation of the base by the additive manufacturing method. The channels may interconnect with one another. The channel is defined by surfaces of the multi-layer composite, with no other material. In specific, the channels do not contain an additional structure other than the structure of the multi-layer composite, such as a separate tube, piping, or a conduit that is formed separately from the composite and placed within the composite base layer. In use, a fluid, that may be a gas or a liquid, flows through the channels in contact with sidewalls of the channels made of the multi-layer composite, with no other material present to form or define the interior surface of the channel.

Channels (e.g., cooling channels) function to circulate a fluid (e.g., water or another liquid for heat exchange) through the interior portion of the base, to control the temperature of the base. The channels are formed at the interior of the base and extend in horizontal directions relative to an area of the base, viewed vertically (e.g., from above, from a "top view"). Alternatively, the channels may extend in directions other than the horizontal directions, such as vertical directions. The channels include at least one inlet in the base that allows the fluid to enter the base, and at least one outlet that allows the fluid to exit the base.

A channel (e.g., cooling channel), or portion thereof, that is part of the base may be at any useful location within the interior of the base, and in any useful pattern relative to an area of the base. Advantageously, channels of a base as described may be formed in the base to provide improved performance (heat exchange, e.g., cooling) relative to channels formed by machining techniques. A channel formed by an additive manufacturing technique may be more precise, may be formed with alternative cross-sectional shapes (that cannot be formed by machining), may be formed to more intricate (serpentine) patterns, and may be formed in a base at a higher density of the channels relative to channels formed by machining (meaning the channels account for a larger percent of the total volume of the base structure as compared to channels formed by machining). Examples of cross-sectional shapes of a channel include shapes that are circular, triangular, hexagonal, dome-shaped (curved on one end and flat at an opposite end), and teardrop-shaped. The cross-sectional shapes of the channel are achieved by the additive manufacturing process descripted above.

Figure 2A:
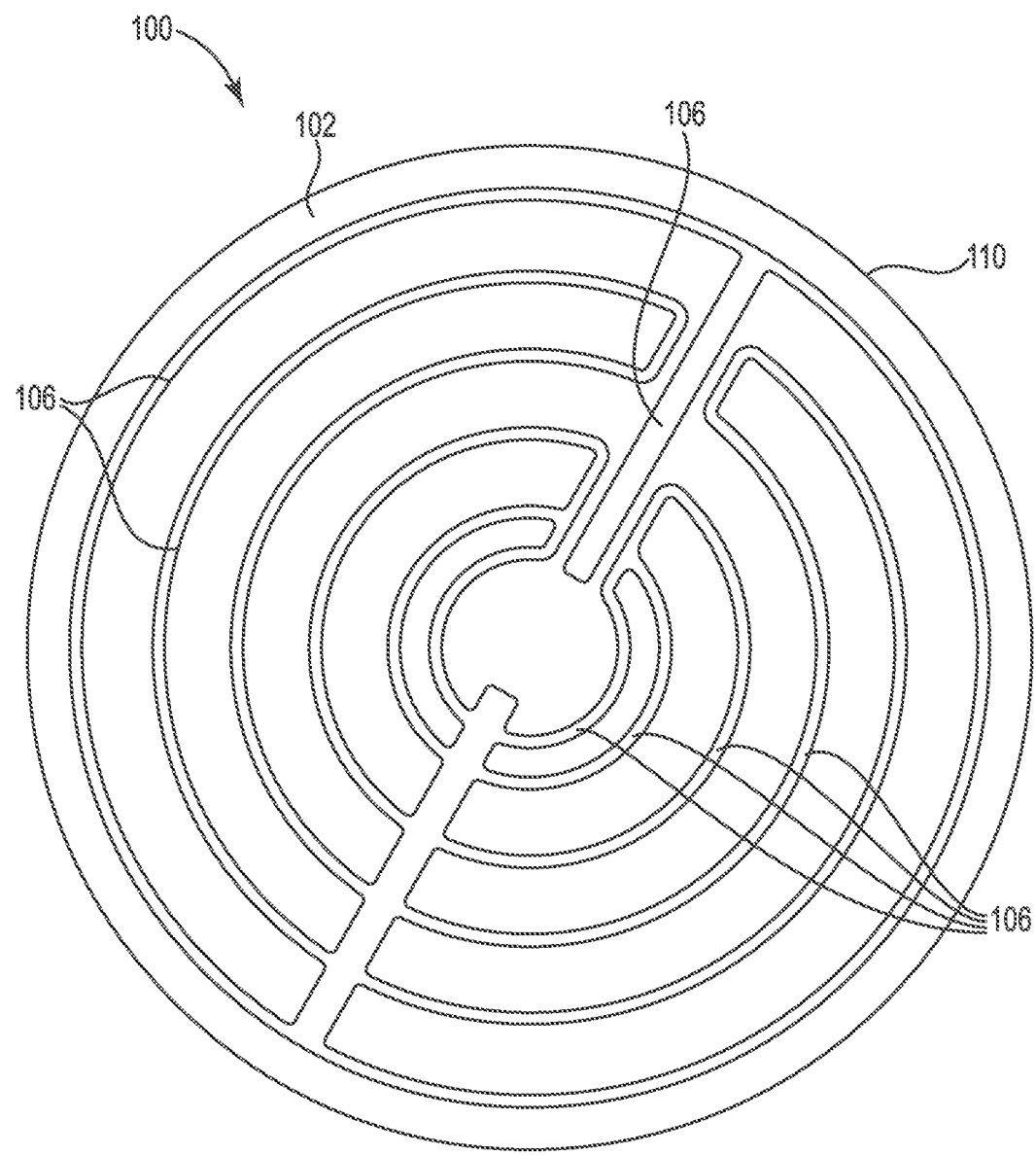
FIG. 2A is a top view of a base as described.
Figure 2C:
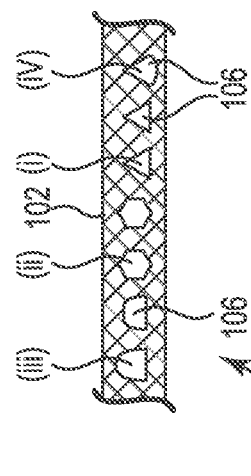
FIGS. 2B and 2C show side cut-away views of a base as described.
Figure 2B:
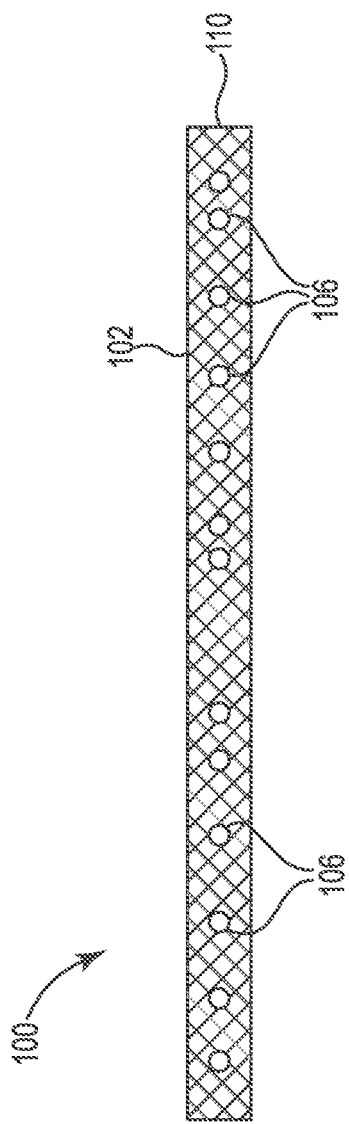

FIGS. 2A and 2B illustrate a single example of base 100 of the present description. Base 100 includes a perimeter 110, an upper surface 102, a lower surface 104, and a thickness between the two opposed surfaces. Cooling channels 106 (shown as having circular cross-sections) are present as a serpentine pattern at an interior portion of the base.

FIG. 2C shows examples of cross-sectional shapes of different cooling channels, including cross-sections that are triangular (i), hexagonal (ii), dome-shaped (curved on one end and flat at an opposite end) (iii), and teardrop-shaped (iv).

In these or other cross-sectional shapes, other features of the channels (e.g., cooling channels) can be also incorporated into the base design that are not possible or easily accomplished using a machining technique. For example, channels may be formed to have a larger volume toward a top surface of a base compared to a bottom surface of the base; the channels may be shaped with a larger portion of the channel toward the top surface, or with the channel being located closer to the top surface and farther from the bottom surface. Alternately of additionally, a heat exchanging loop may be located at different levels of the thickness of the base, and not at a single level of the base thickness; some sections of a heat exchanging loop may be located at a different thickness level (closer to or farther from a top surface) compared to other sections. Alternately or additionally, a cross section of a channel may vary based on location within the base; a cross section may be smaller in size (cross-sectional area) or shaped differently at a portion of the base near the base center, and larger or shaped differently at an edge (or vice versa) to allow for more uniform heat transfer.

A base as described can be prepared by additive manufacturing methods that form dense metal or metal matrix composite multi-layer composite structures using a series of individual layer-forming steps. As one example, the technique referred to as selective laser melting (SLM) is a version of additive manufacturing technology that can be used to form a multi-layer composite in a layer-by-layer fashion. Selective laser melting uses high-power laser energy to selectively cause metal or metal matrix composite particles of a feedstock layer to melt, flow, and form a substantially continuous solidified feedstock layer.

More specifically, a multi-layer composite may be built by sequential steps of producing many thin cross sections ("solidified feedstock" of a "layer," herein) of a larger three-dimensional structure (composite). A layer of feedstock is formed, and includes many particles of metal or metal matrix composite. Laser energy is selectively applied to the feedstock layer over a portion of a layer of the feedstock. The laser energy melts particles at the portion of the feedstock that are exposed to the laser energy. The melted particles liquefy and flow into a continuous layer of the material of the melted particles and then cool to solidify as a layer of solidified feedstock. After an initial layer of solidified feedstock is formed, an additional thin layer of the feedstock is deposited over the top surface of the completed layer that contains the solidified feedstock. The process is repeated to form multiple layers of the solidified feedstock, each layer being formed on top of and adhering to a top surface of a previous layer. Multiple layers are deposited, successively, one over each completed layer, to form a multi-layer composite that is a composite of each layer of solidified feedstock. The multiple layers may be of the same composition and thickness, or may be of different compositions and different layer thicknesses.

Figure 3A:
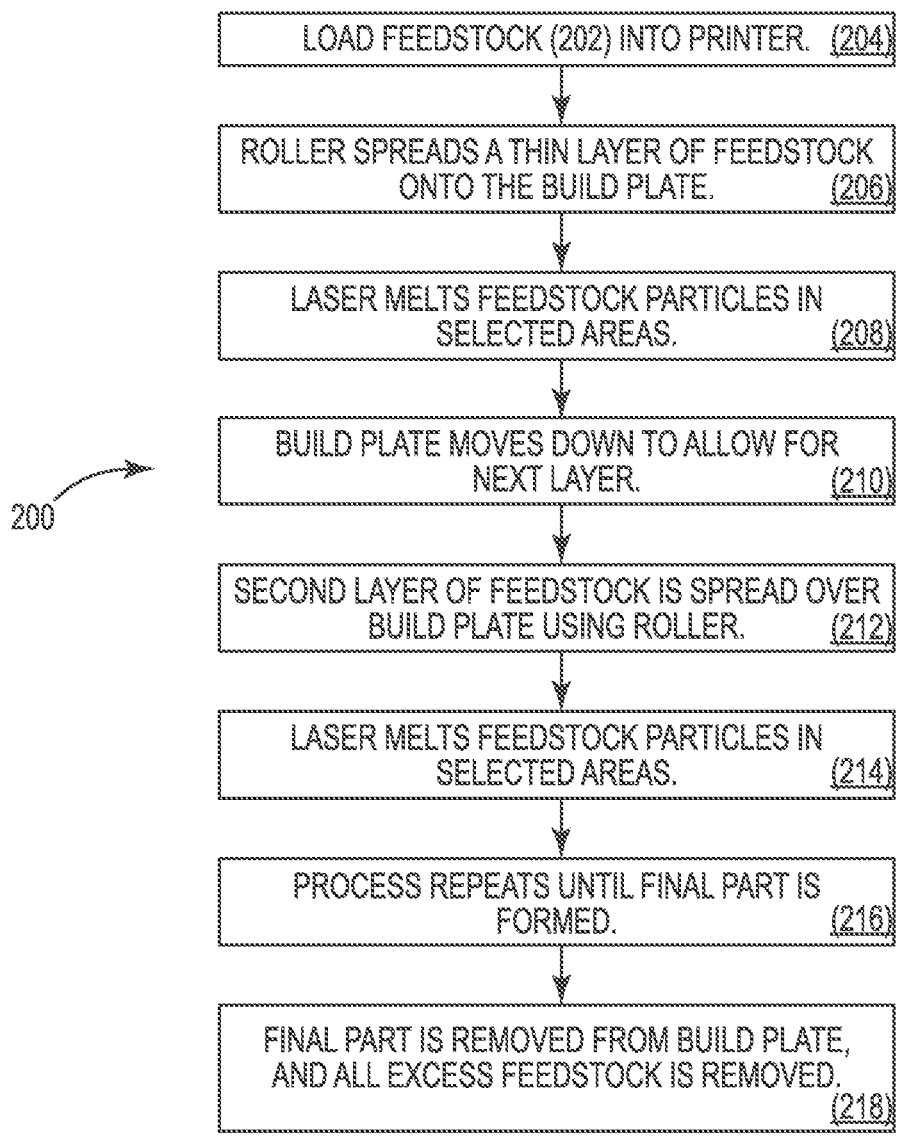
FIG. 3A shows steps of an example method as described.

An example of a selective laser melting additive manufacturing technique (200) useful for preparing a multi-layer composite as described, is shown at FIG. 3A. The process can be performed using commercially available selective laser melting additive manufacturing equipment and particles to form feedstock. Feedstock 202 is a powder that contains a collection of inorganic particles. According to example steps as shown at FIG. 3A, powder feedstock (202) contained by a selective laser melting additive manufacturing apparatus is formed as an even layer over a build plate of the apparatus (204, 206). In a subsequent step (208), a source of electromagnetic radiation (e.g., a high powered laser) selectively irradiates a portion of this first layer of feedstock with radiation of a wavelength and energy that will melt the particles. The melted particles flow into a continuous film and then solidify by cooling. The layer of feedstock may be a fine layer or a coarse layer, and may have any useful thickness. The solidified material of the melted particles forms solidified feedstock at the irradiated portion. Portions of the feedstock layer that are not formed to solidified feedstock remain as the original liquid feedstock.

The build plate is moved down (210) and a second layer (either a fine layer or a coarse layer) of the powder feedstock is formed (212) as a second even layer over the first feedstock layer and over the solidified feedstock of the first feedstock layer. The source of electromagnetic radiation then selectively irradiates a portion of the second layer (214), which causes particles at the portion to melt. The melted portions then cool to form solidified feedstock at the portions of the second layer. Portions of the second layer that are not formed to solidified feedstock remain as the original powder feedstock. Steps 212, 214, and 216 are repeated (218) to form a completed multi-layer solidified feedstock composite surrounded by the original liquid feedstock (202).

The multi-layer solidified feedstock composite is a body that contains the solidified feedstock of each formed layer, and is composed of multiple continuous layers made from the material of the melted particles of the feedstock. The original feedstock (202) can be removed and separated from the multi-layer composite (218).

Figure 3B:
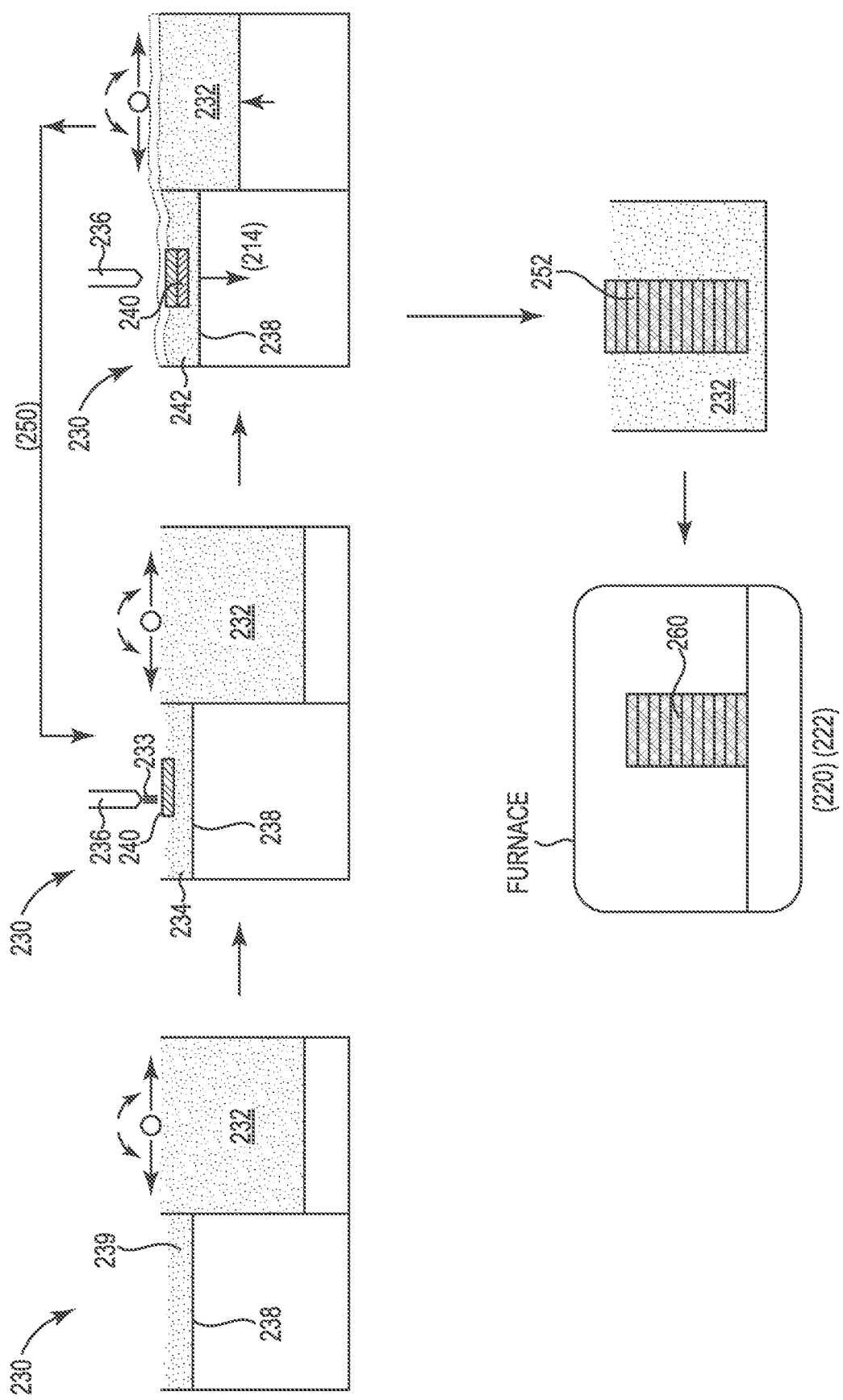
FIG. 3B shows steps of an example method as described.

Referring to FIG. 3B, an example process can be performed using commercially available selective laser melting additive manufacturing apparatus (230), and using powder feedstock (232) according to the present description. According to example steps of the method, feedstock (232) is formed as an even feedstock layer (234) over a build plate (238) of the apparatus (230). Laser (236) applies electromagnetic radiation (233) to a portion of the first layer (234), which causes particles of feedstock to melt and flow to a continuous layer, which is then allowed to cool to form first solidified feedstock (240) at the portion. Portions of feedstock layer (234) that are not formed to solidified feedstock (240) remain as the original feedstock (232). The build plate (238) is moved down (214) and a second or subsequent feedstock layer (242) is formed over the first layer (234) and the first solidified feedstock (240). The laser (236) then selectively applies electromagnetic radiation (233) to portions of the second layer (242), causing particles of the feedstock to melt and flow to form a continuous layer, which is allowed to cool and form solidified feedstock from the second layer. Portions of the second layer that are not formed to solidified feedstock remain as the original powder feedstock. The sequence is repeated (250) to form a completed multi-layer solidified feedstock composite (252) surrounded by the original feedstock (232). The multi-layer solidified feedstock composite (252) is a body that contains the solidified feedstock of each formed layer, and is composed of the material of the melted particles of the feedstock. The original feedstock (232) can be removed and separated from the multi-layer composite (252).

The invention claimed is:

1. A chuck base comprising:
an upper chuck base surface made of an inorganic composite,
a lower chuck base surface made of the inorganic composite,
an interior portion between the upper chuck base surface and the lower chuck base surface, made of the inorganic composite, and
channels within the interior portion, formed by the inorganic composite, the upper chuck base surface, the lower chuck base surface, and the interior portion including a continuous layer of the inorganic composite that extends from the upper chuck base surface to the lower chuck base surface,
wherein at least one of the upper chuck base surface and the lower chuck base surface has a surface roughness that is less than 50 microns.

2. The chuck base of claim 1, wherein the continuous layer of the inorganic composite is seamless, and wherein the inorganic composite is uniform in composition.

3. The chuck base of claim 1, wherein the channels have cross sections that are selected from circular, triangular, dome-shaped, hexagonal, or teardrop-shaped.

4. The chuck base of claim 1 wherein at least one of the upper chuck base surface, lower chuck base surface or the interior portion of the chuck base has a density of at least 99.6 percent.

5. The chuck base of claim 1, wherein the channels are interconnected.

6. The chuck base of claim 1, wherein the inorganic material has a coefficient of thermal expansion in a range from $5\times10^{-6}$ m/(m K) to $10\times10^{-6}$ m/(m K).

7. The chuck base of claim 1, wherein the inorganic material is an aluminum alloy.

8. The chuck base of claim 6, wherein the aluminum alloy is AlSiMg.

9. The chuck base of claim 1, wherein the inorganic material is a titanium alloy.

10. The chuck base of claim 8, wherein the titanium alloy is $Ti_6Al_4V$.

11. The chuck base of claim 1, wherein inorganic material at an interior portion has an apparent density of less than 99.6 percent.

12. A method of forming a chuck base by additive manufacturing, the method comprising:
forming a lower portion of the chuck base that includes a continuous bottom surface, by additive manufacturing,
forming a middle portion of the chuck base that includes cooling channels, over the lower portion of the chuck base, by additive manufacturing, and
forming an upper portion of the chuck base that includes a continuous upper surface, over the middle portion of the chuck base, by additive manufacturing.

13. The method of claim 12, comprising:
forming the lower portion of the chuck base by additive manufacturing includes forming multiple first fine layers, each first fine layers having a first fine layer thickness,
forming the middle portion of the chuck base by additive manufacturing includes forming multiple coarse layers, each coarse layer having a coarse layer thickness that is greater than the fine layer thickness, and
forming the upper portion of the chuck base by additive manufacturing includes forming multiple second fine layers, each second fine layers having a second fine layer thickness.

14. The method of claim 13, wherein
each of the first fine layer thickness and the second fine layer thickness is less than 40 microns, and
the coarse layer thickness is greater than 60 microns.

15. The method of claim 12, wherein:
at least one of chuck base surfaces has a surface roughness that is less than 50 microns,
at least the upper portion of the chuck base or the lower portion of the chuck base has an apparent density of at least 99.6 percent, or
both.

16. The method of claim 12, wherein the inorganic material at the middle portion of the chuck base has an apparent density of less than 99.6 percent.

17. The method of claim 12, wherein the lower portion of the chuck base, the middle portion of the chuck base, and the upper portion of the chuck base include a same composite.

18. The method of claim 12, wherein the lower portion of the chuck base, the middle portion of the chuck base, and the upper portion of the chuck base are seamlessly connected.

19. The method of claim 12, wherein the lower portion of the chuck base, the middle portion of the chuck base, and the upper portion of the chuck base are formed in one continuous additive manufacturing process using a composite.

* * * * *